(12) United States Patent
Heinrich et al.

(10) Patent No.: US 7,938,943 B2
(45) Date of Patent: May 10, 2011

(54) SUPPLY END BLOCK FOR ROTARY MAGNETRON

(75) Inventors: Hans-Juergen Heinrich, Kleinroehrsdorf (DE); Goetz Teschner, Dresden (DE); Thorsten Sander, Dresden (DE); Cornell Weidelt, Dresden (DE); Joern Brueckner, Langebrueck (DE)

(73) Assignee: Von Ardenne Anlagentechnic GmbH, Dresden (DE)

( * ) Notice: Subject to any disclaimer, the term of this patent is extended or adjusted under 35 U.S.C. 154(b) by 874 days.

(21) Appl. No.: 11/873,532

(22) Filed: Oct. 17, 2007

(65) Prior Publication Data
US 2008/0128276 A1 Jun. 5, 2008

(30) Foreign Application Priority Data
Oct. 17, 2006 (DE) .......................... 10 2006 049 497

(51) Int. Cl.
*C23C 14/34* (2006.01)
(52) U.S. Cl. .......... 204/298.09; 204/298.21; 204/298.22
(58) Field of Classification Search ............. 204/298.09, 204/298.21, 298.22
See application file for complete search history.

(56) References Cited

U.S. PATENT DOCUMENTS

| 3,884,793 | A | 5/1975 | Penfold et al. ............. 204/298 |
| 5,445,721 | A * | 8/1995 | Bower ..................... 204/192.12 |
| 6,841,051 | B2 * | 1/2005 | Crowley .................. 204/298.22 |
| 2003/0136672 | A1 | 7/2003 | Barrett ..................... 204/298.22 |
| 2004/0149576 | A1 | 8/2004 | Crowley .................. 204/298.21 |

FOREIGN PATENT DOCUMENTS
DE  2 243 708  9/1972
* cited by examiner

*Primary Examiner* — Rodney G McDonald
(74) *Attorney, Agent, or Firm* — Heslin Rothenberg Farley & Mesiti P.C.

(57) ABSTRACT

A supply end block to supply a sputter cathode with a coolant and electrical voltage, includes a housing with a coolant connection and a current connection as well as a support shaft mounted to rotate, on which a target tube is fastened. The coolant connection and current connection are brought together directly at a feed site so that the coolant is brought to the potential of the applied electric voltage on entering the housing of the end block. Optimal cooling of the current feed is achieved, and optimal potential equalization of the coolant simultaneously occurs.

7 Claims, 5 Drawing Sheets

A-A

SUPPLY END BLOCK FOR ROTARY MAGNETRON

CROSS REFERENCE TO RELATED APPLICATIONS

Figure 1:
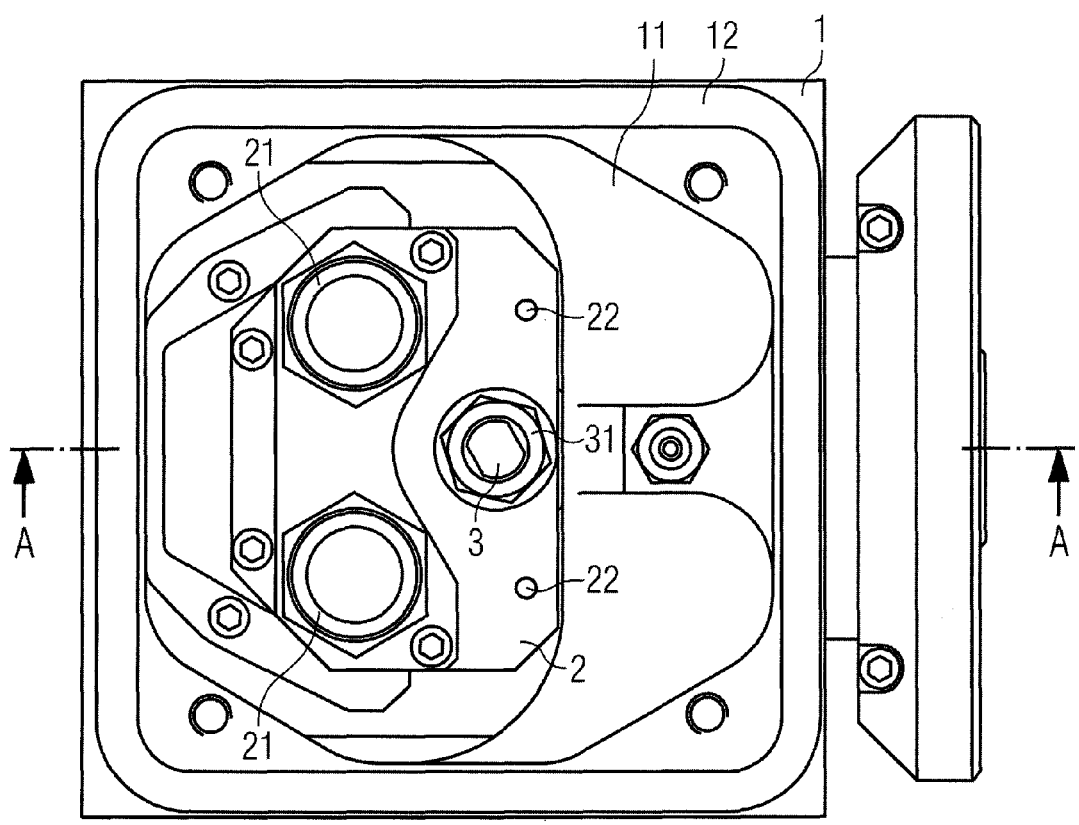

This application claims priority from German patent application No. DE 102006049497.0, filed on Oct. 17, 2006, the entire disclosure of which is incorporated herein by reference.

BACKGROUND ART

The invention concerns a connection end block to supply a sputter cathode with a coolant and electrical voltage.

In ordinary sputtering devices for high vacuum coating by cathode sputtering, plate-like targets are generally mounted on a magnetron and the material of the target then atomized by ion bombardment. Because of the rigid arrangement of the target and magnetron relative to each other, recesses or pits are formed with time in the target material at the sites at which the target material is preferentially atomized because of the magnetic lines of force. The yield of target material is relatively low on this account, since the target must be replaced prematurely.

To avoid this effect different solutions for sputtering devices have been proposed for use during coating of substrates by cathode sputtering. A rotatable sputter cathode is known from U.S. Pat. No. 4,356,073, which includes an elongated cylindrical tubular element, in addition to other components, which is provided with a layer of the desired coating material. A rotatable sputter cathode is also known from U.S. Pat. No. 4,443,318, which includes an elongated cylindrical tubular element, means to rotate the tubular element and a target device with coating material, which are releasably mounted on the tubular element.

In the mentioned solutions a situation can be achieved by rotating the tubular element in which material ablation occurs over the entire extent of the tube-target uniformly and in this way formation of recesses or pits of the target material is prevented.

The term sputtering device is to be understood to mean in this application an arrangement that includes at least one magnetron and sputter cathode with one or more targets.

To supply the sputtering device with coolant and electrical voltage so called connection end blocks are mounted within the vacuum chamber of the coating device, which have separate connections for a coolant and electrical power supply of the sputtering device arranged in the vacuum chamber. Both media are therefore fed separately to the connection end block and brought to the same electric potential in assemblies mounted in front. Current feed then generally occurs via sliding contacts. Transfer of the rotational movement to the target tube generally occurs by means of a second drive end block. A problem in these solutions is that the pressure behavior of the sliding contacts relative to the abrasion pattern is not optimal. Because of this the current feed is non-uniform. The relatively long conductors of the sliding contacts (also referred to as carbon brushes) cannot be directly cooled for contacts, so that especially during medium frequency operations, the current is limited by heating of the wires and therefore the admissible maximum temperature of the insulation. Potential adjustment of the cooling water must be carried out in an additional assembly. The conductors on the sliding contacts can exert a tensile load on the sliding contacts so that after assembly it is not ensured that the sliding contacts are pressed at the prescribed position with the prescribed force onto the shaft. The previous solution with tubes and wires on the supply end box leads to a high assembly expense and error possibilities during assembly.

Such connection end blocks are known, for example, from WO 2006/042808 A1, US 2004/0149576 A1 and WO 02/38826 A1.

In the solution according to WO 2006/042808 A1 a base with a contact ring and a spindle mounted to rotate coaxially in the base with a number of electrically conducting sliding contacts forced upward by elastic elements that produce electrical contact with the contact ring of the base [are used] for voltage supply. This solution has the main drawback that the propagation determined by the skin and proximity effect cannot be allowed for so that a restriction occurs in current carrying capacity. Another significant drawback is the limited decoupling of the sliding pair from the component tolerances. This solution requires reliable alignment of the participating partners in the sliding contact.

In the solution according to US 2004/0149576 A1 the sliding contact lies in cooling water. This solution is successful for DC operation. During medium frequency operation the current must flow over all bearings so that special precautions must be taken so that the bearings withstand the medium frequency current.

With the solution according to WO 02/38826 A1 a sliding contact lies in the vacuum. Very high friction coefficients occur in vacuum so that the sliding contacts wear inadmissibly rapidly and also release the abraded carbon into the vacuum chamber.

The task of the invention therefore consists of providing a connection end block to supply a sputtering device with a coolant and electrical power, which permits uniform current feed and potential equalization for the coolant without using additional assemblies.

These tasks are solved according to the invention by the connection end block described below.

BRIEF SUMMARY OF THE INVENTION

In a connection end block for the supply of sputter cathode with a coolant and electrical power, which includes a housing with a cooling connection and a current connection as well as a support shaft mounted to rotate, on which the target tube is fastened, it is proposed that the coolant connection and the current connection be directly combined at the feed site, that the coolant be brought to the potential of the applied electric voltage on entering the housing of the end block. Because of this a dual effect is achieved. On the one hand, optimal cooling of the current feed is achieved, and on the other hand, optimal potential equalization of the coolant simultaneously occurs.

For example, it can be provided that an electrically conducting base element with a coolant channel be arranged in the housing of the connection end block, the coolant channel is connected to the coolant feed via the coolant connection and the current connection is connected electrically conducting to the base element.

In addition, it is provided in a supply end block with at least two sliding contacts acting radially on the support shaft that the sliding contacts (for example, carbon brushes) are decoupled from the support structure (housing, base element) of the supply end block in that the sliding contacts are connected via short feed lines (subsequently also referred to uniformly as connection wires), for example, copper conductors or copper wires, on a contact ring, which can be made, for example, of solid copper. Because of this guiding of medium frequency current to the sliding contacts (for example, carbon brushes) is significantly improved. The contact ring can be fastened, for example, by means of a tie bolt to the bottom of the base element.

Another feature of the proposed supply end block can consist of the fact that tolerances during manufacture of the supply end block are compensated by the fact that the connection wires, through which the medium frequency current is transferred to the sliding contacts, are guided from the contact ring in oblique directions to the sliding contacts. This achieves the situation in which the position changes from slight rotation of the connection wire can be compensated. The wording "in the oblique direction" then means that the connection wires have a section between the contact ring and the sliding contact that does not run radially (90°) but tangentially (0°) or with an angle lying between the radial and tangential direction relative to the periphery of the support shaft.

Connection of the connection wires to the contact ring can occur, for example, via a spring-loaded clamping site. Such a clamping site can include, for example, a pressure cylinder provided with a through-hole to accommodate the end of a connection wire, mounted in a hole of the contact ring, in which the hole of the contact ring is a blind hole in which a compression spring is arranged.

The sliding contacts can also be configured so that the current flow can occur on the shortest possible path from the contact ring via the feed line, for example, the copper conductor or copper wire, and the sliding contact to the support shaft. It has proven to be particularly advantageous for uniform pressing of the sliding contacts against the support shaft to provide a common spring element, for example, an annular spring that wraps around all sliding contacts and forces them in the radial direction toward the shaft. The annular spring can, for example, be a long coil spring guided around the arrangement of sliding contacts and whose ends are connected to each other by an appropriate connection element.

BRIEF DESCRIPTION OF THE DRAWING FIGURES

Figure 2:
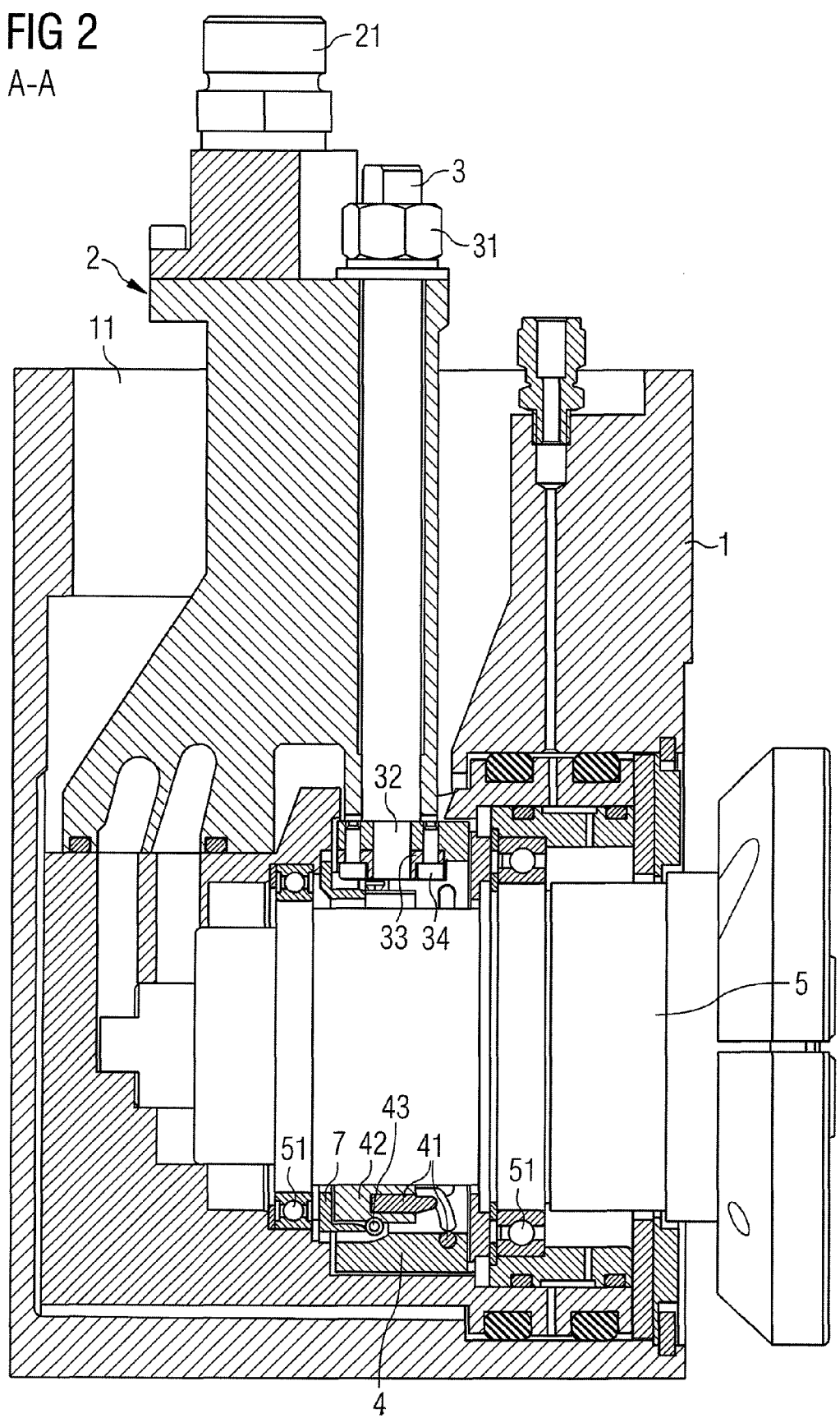
Figure 3:
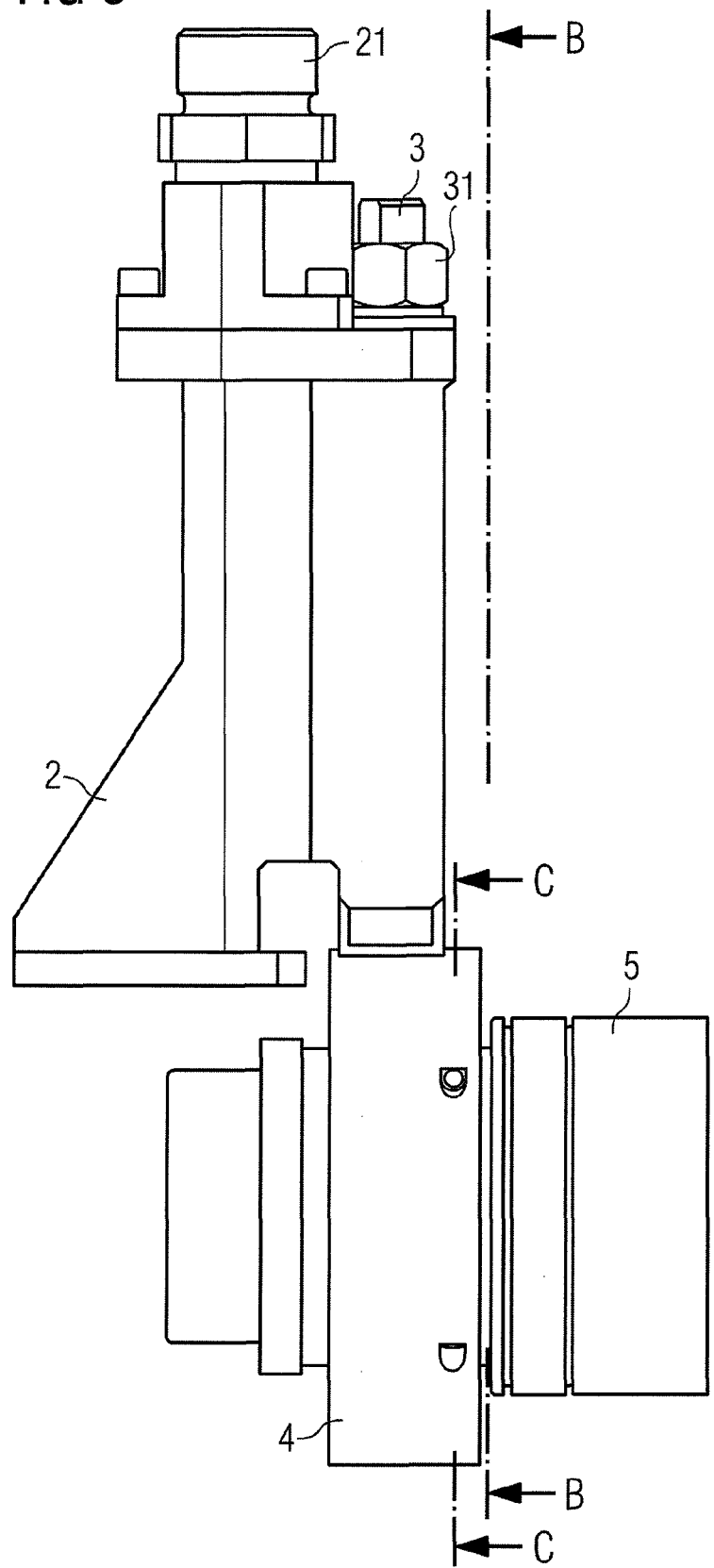
Figure 4:
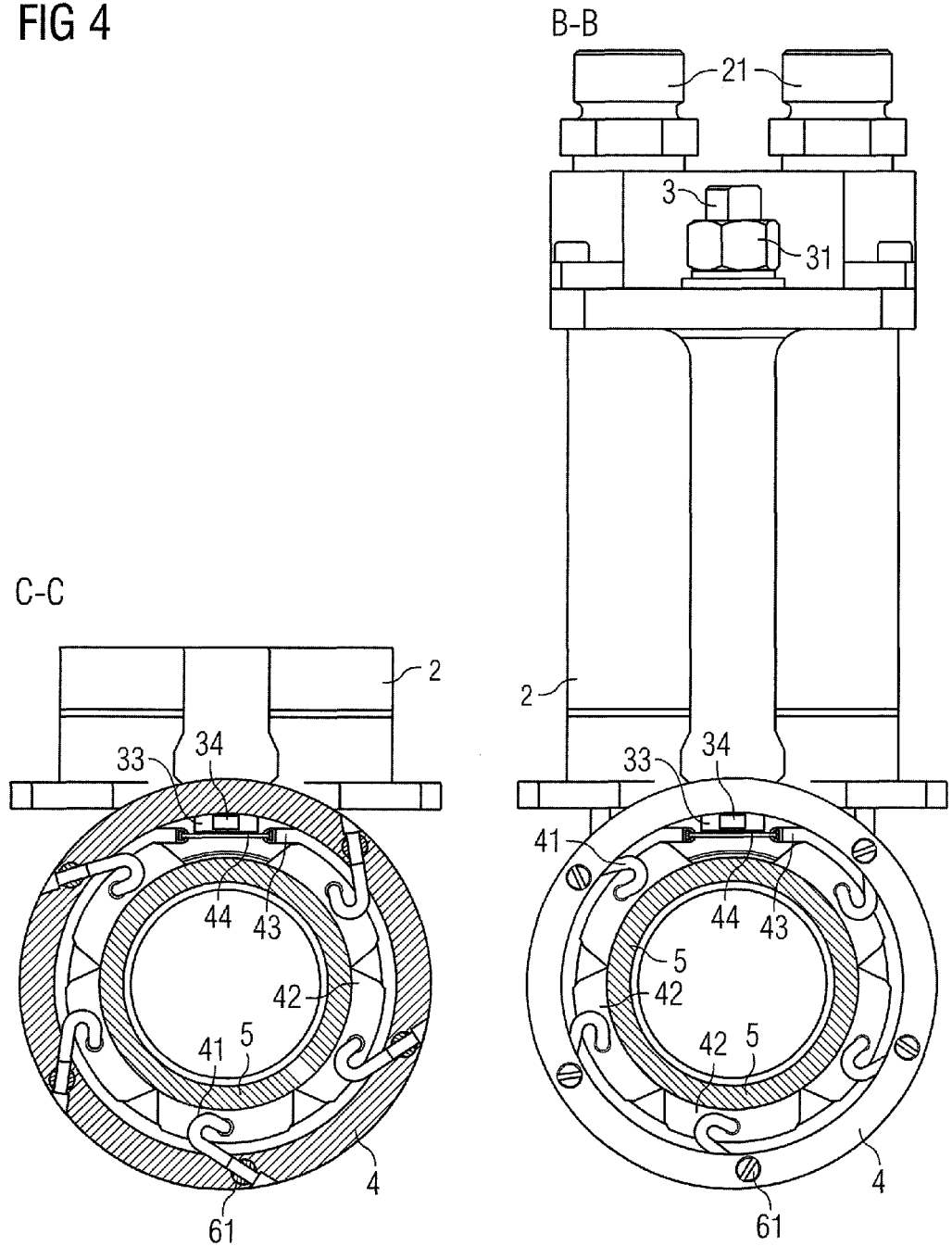
Figure 5:
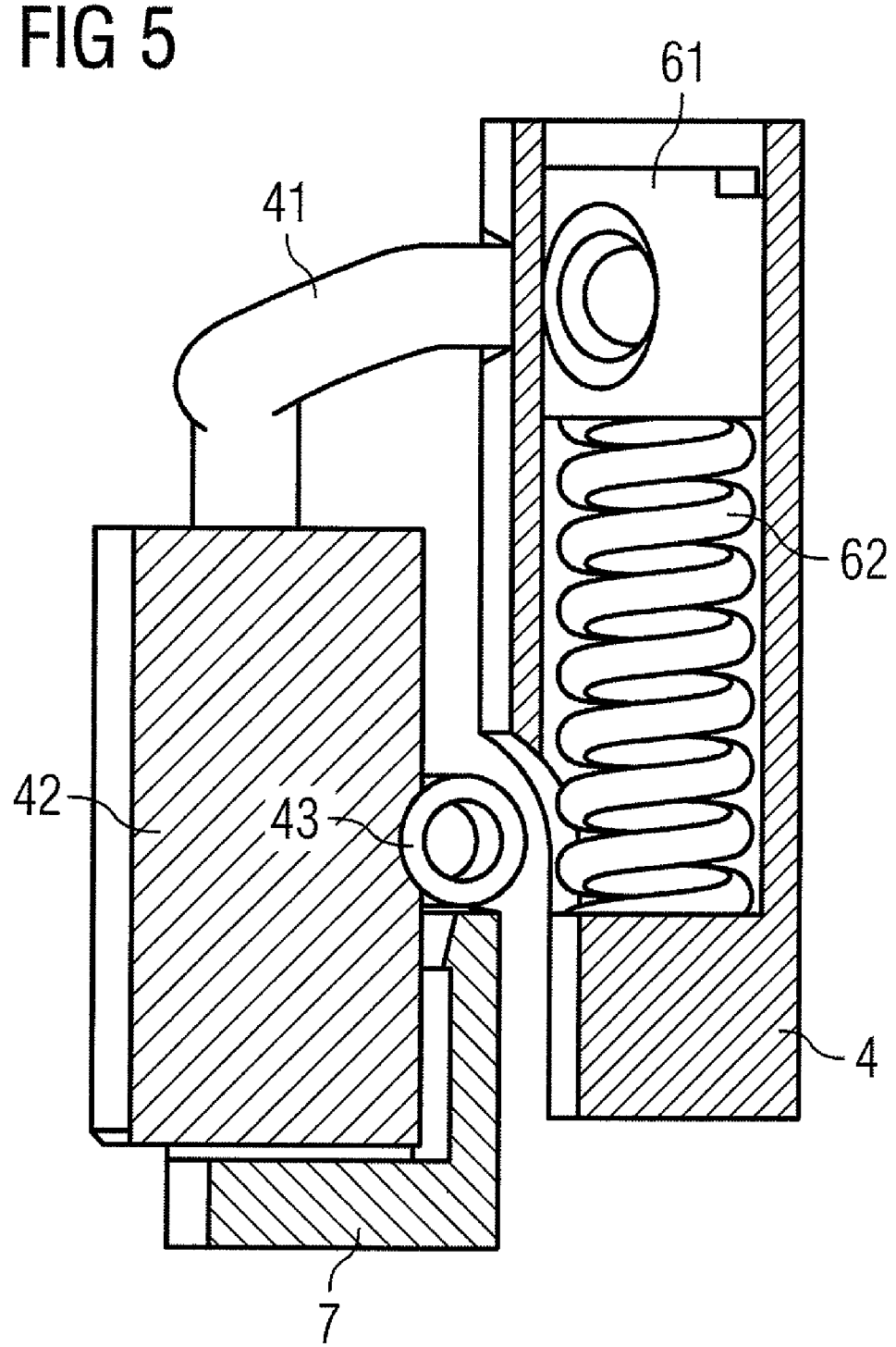

The invention is further explained below by means of a practical example and corresponding drawings. In the drawings FIG. 1 shows a top view of a supply end block according to the invention, FIG. 2 shows a longitudinal section through the supply end block according to FIG. 1, FIG. 3 shows a side view of certain parts of the supply end block, FIG. 4 shows two additional sectional views of the supply end block according to FIG. 3, FIG. 5 shows a detailed view of a sliding contact as well as its fastening in the contact ring.

DETAILED DESCRIPTION

For reasons of better clarity all components of the supply end block according to the invention are not shown in all figures. Thus, in all the figures, the actually required sealing bundles for the coolant loop and for the vacuum were omitted. These are normally arranged on both sides of the ball bearing 51 shown in the figures. Moreover, additional components, especially housing 1, were left out in FIGS. 3 and 4.

In the top view of FIG. 1 the housing 1 is recognizable in that on its top an opening 11 is present which can be closed by a cover (not shown). For this purpose a seal 12 is provided on housing 1. The base element 2 is arranged in housing 1. Two coolant connections 21 as well as six current connections 22 are situated on base element 2. The base element 2 accordingly has channels for the coolant as well as hole for the tie bolt 3, which is screwed onto the top of base element 2 by means of a nut 31. The function of the tie bolt 3 is further explained below.

FIG. 2 shows a section through the supply end block from FIG. 1 along line A-A. The base element 2 extends from opening 11 of housing 1 with the coolant connections 21 applied to it and the current connections 22 not recognizable here. The tie bolt 3 with nut 31 is also apparent, which extends downward through a hole provided for it in base element 2. The tie bolt 3 has a threaded pin 32 on its lower end, whose function is explained later.

The support shaft 5, on whose free end a target tube can be mounted, is positioned in the lower part of the housing 1 beneath the base element 2 in two ball bearings 51. A central area of support shaft 5 serves to produce electrical contact with the sliding contacts, which are designed as carbon brushes 42 in the practical example. The carbon brushes 42 are arranged distributed in a uniform arrangement around the periphery of support shaft 5 and are forced by an annular spring 43 enclosing all carbon brushes 42 onto its surface. The carbon brushes 42 are positioned by means of connection wires 41 in a contact ring 4 enclosing the support shaft 5, as well as a guide ring 7 that facilitates annular arrangement of the carbon brushes 42. The details of this support are explained in detail in the description for FIGS. 4 and 5.

Contact ring 4 is fastened by the tie bolt 3 in its position relative to base element 2 and support shaft 5, to which it is arranged concentric. For this purpose the contact ring 4 has a hole on its top through which the threaded pin 32 of tie bolt 3 extends into the interior of contact ring 4, where it is screwed into the threaded hole of a pressure piece 33, which is screwed to the inside of contact ring 4 by means of screws 34. By tightening nut 31 of tie bolt 3 the contact ring 4 is fixed in this position on the bottom of base element 2.

The depiction in FIG. 3 is reduced to the base element 2 with the cooling connections 21, the tie bolt 3 with nut 31, contact ring 4 as well as support shaft 5. The cutting lines B-B and C-C are also shown, which denote cutting planes that form the basis of the depictions in FIG. 4. It is particularly recognizable in FIG. 3 how the contact ring 4 is supported on the bottom of base element 2 and how the support shaft 5 is traversed by contact ring 4.

FIG. 4 shows the two sectional views B-B and C-C according to the depiction in FIG. 3 in which in the depiction C-C the upper part of the base element 2 was again omitted, since this area is identical to the upper part of the depiction B-B.

In the depiction B-B the section is only passed through the outer part of support shaft 5 that serves to accommodate the target tube. On this account a view from the outside falls on the end of the contact ring 4. On the other hand, section C-C passes through contact ring 4 so that fastening of the connection wires 41 in the contact ring 4 is also recognizable. In both depictions it is apparent that the contact ring 4 is fastened by means of pressure piece 33 and tie bolt 3 as well as nut 31 to the bottom of base element 2.

Five carbon brushes 42 are apparent between contact ring 4 and support shaft 5, each of which is connected to the contact ring 4 by means of three connection wires 41. At the same time, carbon brushes 42 lie against the surface of support shaft 5. They are pressed onto this surface by a force acting radially on them, which is exerted by an annular spring 43 that encloses the entire arrangement of carbon brushes 42. In the practical example the annular spring 43 is a coil spring, which is placed around the circular arrangement of carbon brushes 42 and whose two ends are connected to each other by a connection element 44.

The connection wires 41 are doubly bent. One end extends in the axial direction of support shaft 5 into a hole provided for it in the carbon brushes 42. In the middle area the connection wires 41 are U-shaped. In a first partial section of the middle area the connection wire is initially bent from the axial direction of support shaft 5 in an oblique, roughly tangential or peripheral direction relative to support shaft 5 and then bent further in a second partial section of the middle area so that the second partial section of the U-shaped middle area extends almost opposite the first partial section. Because of this the connection wires 41 enter the holes of contact ring 4 provided for them obliquely, where they are fastened by means of clamping cylinders 61, whose design and function is further explained in the description for FIG. 5.

It is particularly apparent in depiction C-C how the connection wires 41 are fastened in contact ring 4. Contact ring 4 has axial holes distributed over its periphery in each of which a clamping cylinder 61 extends. Each clamping cylinder 61 has a radial through-hole which serves to accommodate one end of a connection wire 41. In order to align this through-opening with a corresponding hole of contact ring 4, the clamping cylinders 61 have a slit on their end so that they can be turned with an ordinary screwdriver.

A detailed depiction of the mutual arrangement of contact ring 4, connection wire 41 and carbon brushes 42 is shown in FIG. 5. In the selected sectional view it is apparent how the clamping cylinder 61 is mounted in the hole of contact ring 4. The hole is also designed as a blind hole in which a compression spring 62 is arranged beneath the clamping cylinder 61. The clamping cylinder 61 has a lateral through-hole, which serves to accommodate one end of a connection wire 41. This through-hole can be aligned with the hole in contact ring 4 that serves the same purpose by rotating the clamping cylinder 61 by means of a screwdriver, as described above, in the blind hole. When the end of the connection wire 41 is introduced to the hole of a contact ring 4 and the through-hole of the clamping cylinder 61, the force exerted by the compression spring 62 on the clamping cylinder 61 in the axial direction of support shaft 5, i.e., across the connection wire 41, ensures that the connection wire 41 is clamped so that the connection wire 41 as well as the sliding contact 42 arranged on its other end are fastened relative to contact ring 4. At the same time the type of fastening of sliding contact 42 on contact ring 4 by means of connection wire 41 ensures that manufacturing tolerances are simply and automatically compensated.

The position of the annular spring 43 on the outside of carbon brush 42, i.e., on the surface of the side of carbon brush 42 facing away from support shaft 5 (not shown here), is also apparent in FIG. 5. FIG. 5 also shows how the guide ring 7 facilitates the circular arrangement of carbon brushes 42 in which guide ring 7 supports the carbon brushes 42 in the radial and axial direction.

LIST OF REFERENCE NUMBERS

1 Housing
11 Opening
12 Seal
2 Base element
21 Coolant connection
22 Current connection
3 Tie bolt
31 Nut
32 Threaded pin
33 Pressure piece
34 Screw
4 Contact ring
41 Connection wire
42 Sliding contact, carbon brush
43 Annular spring
44 Connection element
5 Support shaft
51 Ball bearing
61 Clamping cylinder
62 Compression spring
7 Guide ring

The invention claimed is:

1. Supply end block to supply a sputter cathode with a coolant and electrical voltage, comprising a housing with a coolant connection and a current connection as well as a support shaft mounted to rotate, on which a target tube is fastened, in which the coolant connection and the current connection are combined directly at a feed site in the supply end block so that the coolant is brought to a potential of an applied electrical voltage on entering the housing, at least two sliding contacts acting radially on the support shaft, each sliding contact being connected by at least one connection wire to a contact ring concentric to the support shaft, and wherein each connection wire is guided toward a sliding contact by the contact ring in an oblique direction.

2. The supply end block according to claim 1, wherein each connection wire on a first section fastened in the contact ring runs obliquely to the support shaft, is bent U-shaped in a subsequent second section so that a first partial section runs obliquely toward the support shaft and a second partial section runs obliquely away from support shaft and on a third section fastened in a sliding contact runs axially to the support shaft.

3. Supply end block to supply a sputter cathode with a coolant and electrical voltage, comprising a housing with a coolant connection and a current connection as well as a support shaft mounted to rotate, on which a target tube is fastened, in which the coolant connection and the current connection are combined directly at a feed site in the supply end block so that the coolant is brought to a potential of an applied electrical voltage on entering the housing, at least two sliding contacts acting radially on the support shaft, each sliding contact being connected by at least one connection wire to a contact ring concentric to the support shaft, and a common spring element enclosing all sliding contacts, wherein the common spring element forces all sliding contacts onto the support shaft.

4. The supply end block according to claim 3, wherein the at least two sliding contacts are mounted in a guide ring arranged concentric within the contact ring.

5. The supply end block according to claim 3, wherein an electrically conducting base element with a coolant channel is provided in the housing, the coolant channel is connected to a coolant feed via the coolant connection and the current connection is connected electrically conducting to the base element.

6. The supply end block according to claim 1, wherein the at least two sliding contacts are mounted in a guide ring arranged concentric within the contact ring.

7. The supply end block according to claim 1, wherein an electrically conducting base element with a coolant channel is provided in the housing, the coolant channel is connected to a coolant feed via the coolant connection and the current connection is connected electrically conducting to the base element.

* * * * *

UNITED STATES PATENT AND TRADEMARK OFFICE
CERTIFICATE OF CORRECTION

| | | |
|---|---|---|
| PATENT NO. | : 7,938,943 B2 | Page 1 of 1 |
| APPLICATION NO. | : 11/873532 | |
| DATED | : May 10, 2011 | |
| INVENTOR(S) | : Hans-Juergen Heinrich | |

It is certified that error appears in the above-identified patent and that said Letters Patent is hereby corrected as shown below:

(In the Assignee (73): Delete "Anlagentechnic" and insert --Anlagentechnik--)

Signed and Sealed this
Nineteenth Day of July, 2011

David J. Kappos
*Director of the United States Patent and Trademark Office*